United States Patent
Basol

(10) Patent No.: US 9,103,033 B2
(45) Date of Patent: Aug. 11, 2015

(54) REEL-TO-REEL REACTION OF PRECURSOR FILM TO FORM SOLAR CELL ABSORBER

(75) Inventor: Bulent M. Basol, Manhattan Beach, CA (US)

(73) Assignee: Solopower Systems, Inc., San Jose, CA (US)

(*) Notice: Subject to any disclaimer, the term of this patent is extended or adjusted under 35 U.S.C. 154(b) by 1800 days.

(21) Appl. No.: 11/938,679

(22) Filed: Nov. 12, 2007

(65) Prior Publication Data

US 2008/0095938 A1    Apr. 24, 2008

Related U.S. Application Data

(63) Continuation-in-part of application No. 11/549,590, filed on Oct. 13, 2006.

(60) Provisional application No. 60/865,385, filed on Nov. 10, 2006.

(51) Int. Cl.
C23C 14/56 (2006.01)
C23C 14/06 (2006.01)

(52) U.S. Cl.
CPC ............ C23C 14/562 (2013.01); C23C 14/0623 (2013.01)

(58) Field of Classification Search
CPC ..................................................... C23C 14/562
USPC .................................................. 118/718, 719
See application file for complete search history.

(56) References Cited

U.S. PATENT DOCUMENTS

| | | | |
|---|---|---|---|
| 3,032,890 A | 5/1962 | Brick et al. | |
| 3,505,974 A * | 4/1970 | Barker | 118/718 |
| 4,048,953 A | 9/1977 | Froberg | |
| 4,450,786 A | 5/1984 | Doehler et al. | |
| 4,485,125 A * | 11/1984 | Izu et al. | 427/74 |
| 4,492,181 A | 1/1985 | Ovshinsky et al. | |
| 4,723,507 A * | 2/1988 | Ovshinsky et al. | 118/718 |
| 4,798,660 A | 1/1989 | Ermer et al. | |
| 5,364,481 A | 11/1994 | Sasaki et al. | |

(Continued)

FOREIGN PATENT DOCUMENTS

| | | |
|---|---|---|
| DE | 10006778 A1 | 2/2000 |
| EP | 0661760 | 7/1995 |

(Continued)

OTHER PUBLICATIONS

International Search Report issued Feb. 5, 2010, in PCT/US2009/67394.

(Continued)

*Primary Examiner* — Dah-Wei D Yuan
*Assistant Examiner* — Stephen Kitt

(57) ABSTRACT

A roll-to-roll rapid thermal processing (RTP) tool with multiple chambers for forming a solar cell absorber by reacting a precursor layer on a continuous flexible workpiece. The RTP tool includes an elongated housing having a heating chamber with a predetermined temperature profile, a supply chamber and a receiving chamber. The heating chamber includes a small process gap in which the precursor layer is reacted with a Group VIA material to form an absorber layer. The continuous flexible workpiece is unrolled and advanced from the supply chamber into the heating chamber, and the processed continuous flexible workpiece is taken up and rolled in the receiving chamber.

52 Claims, 3 Drawing Sheets

(56) References Cited

U.S. PATENT DOCUMENTS

| | | | |
|---|---|---|---|
| 5,374,313 A * | 12/1994 | Doehler | 118/719 |
| 5,378,639 A | 1/1995 | Sasaki et al. | |
| 5,520,740 A * | 5/1996 | Kanai et al. | 118/718 |
| 5,571,749 A | 11/1996 | Matsuda | |
| 5,578,503 A | 11/1996 | Karg et al. | |
| 5,861,609 A | 1/1999 | Kaltenbrunner et al. | |
| 6,048,442 A | 4/2000 | Kushiya et al. | |
| 6,092,669 A | 7/2000 | Kushiya et al. | |
| 6,207,219 B1 | 3/2001 | Ikeya et al. | |
| 6,288,366 B1 | 9/2001 | Dings | |
| 6,350,489 B1 * | 2/2002 | Moriyama et al. | 427/255.5 |
| 6,660,094 B2 * | 12/2003 | Otoshi et al. | 118/718 |
| 6,753,272 B1 | 6/2004 | Lee et al. | |
| 7,091,136 B2 | 8/2006 | Basol et al. | |
| 2003/0136517 A1 * | 7/2003 | Hori et al. | 156/345.37 |
| 2004/0063320 A1 | 4/2004 | Hollars | |
| 2004/0089237 A1 | 5/2004 | Pruett et al. | |
| 2004/0161533 A1 * | 8/2004 | Sawayama et al. | 427/248.1 |
| 2007/0111367 A1 | 5/2007 | Basol | |
| 2008/0175993 A1 | 7/2008 | Ashjaee et al. | |

FOREIGN PATENT DOCUMENTS

| | | |
|---|---|---|
| EP | 0782176 | 7/1997 |
| JP | 1012635 | 1/1989 |
| JP | 7235504 | 9/1995 |
| JP | 11-145060 | 5/1999 |
| JP | 2003273135 | 9/2003 |

OTHER PUBLICATIONS

Gabor, et al., "CuInSe2 Thin Film Formation by Rapid Annealing of the Elemental Precursor", *Am. Inst. of Physics*, 1992, pp. 236-272.

Kerr, et al., "Rapid Thermal Processing of CIS Precursors", *IEEE*, 2002, pp. 676-679.

Mooney, et al., "The Formation of CuInSe2 Thin Films by Rapid Thermal Processing", *white paper*, 1990, 9 pages.

Penndorf, et al., "CuInSe2 Thin Film Formation on a Cu Tape Substrate for Photovoltaic Applications", *Solar Energy*, vol. 53, 1998, pp. 285-298.

Probst, et al., MRS Symposium Proc. vol. 426, 1996, pp. 165.

Winkler, et al., "Design, Actual Performance, and Electrical Stability of CISCuT-based Quasi Endless Solar Cell Tapes", *MRS Symp Proc.*, vol. 668, 2002, pp. H3.11.1-H3.11.6.

International Search Report issued Mar. 16, 2009 in PCT/US2009/32418.

International Search Report issued Jul. 28, 2008 in PCT/US07/064432.

European Search Report issued Dec. 15, 2010 n corresponding European application No. 09708293.

Search Report issued May 19, 2011 in corresponding European matter.

Search Report issued Nov. 6, 2012 in corresponding Taiwanese application No. 095138400.

* cited by examiner

REEL-TO-REEL REACTION OF PRECURSOR FILM TO FORM SOLAR CELL ABSORBER

CROSS REFERENCE TO RELATED APPLICATIONS

This is a Continuation-in-Part of U.S. patent application Ser. No. 11/549,590, filed Oct. 13, 2006. This application also claims the benefit of U.S. Provisional Application Ser. No. 60/865,385 filed on Nov. 10, 2006. These applications are incorporated herein, in their entireties, by reference.

FIELD OF THE INVENTION

The present invention relates to method and apparatus for preparing thin films of semiconductor films for radiation detector and photovoltaic applications.

BACKGROUND

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13, which is previously deposited on the substrate 11 and which acts as the electrical contact to the device. The substrate 11 and the conductive layer 13 form a base 20. Various conductive layers comprising Mo, Ta, W, Ti, and stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. It is important for a thin film deposition process to have the capability of controlling both the molar ratio of IB/IIIA, and the molar ratios of the Group IIIA components in the composition. It should be noted that although the chemical formula is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

One technique for growing $Cu(In,Ga)(S,Se)_2$ type compound thin films for solar cell applications is a two-stage process where metallic components of the $Cu(In,Ga)(S,Se)_2$ material are first deposited onto a substrate, and then reacted with S and/or Se in a high temperature annealing process. For example, for $CuInSe_2$ growth, thin layers of Cu and In are first deposited on a substrate and then this stacked precursor layer is reacted with Se at elevated temperature. If the reaction atmosphere also contains sulfur, then a $CuIn(S,Se)_2$ layer can be grown. Addition of Ga in the precursor layer, i.e. use of a Cu/In/Ga stacked film precursor, allows the growth of a $Cu(In,Ga)(S,Se)_2$ absorber.

Two-stage process approach may also employ stacked layers comprising Group VIA materials. For example, a $Cu(In,Ga)Se_2$ film may be obtained by depositing In—Ga—Se and Cu—Se layers in an In—Ga—Se/Cu—Se stack and reacting them in presence of Se. Similarly, stacks comprising Group VIA materials and metallic components may also be used. Stacks comprising Group VIA materials include, but are not limited to In—Ga—Se/Cu stack, Cu/In/Ga/Se stack, Cu/Se/In/Ga/Se stack, etc.

Selenization and/or sulfidation or sulfurization of precursor layers comprising metallic components may be carried out in various forms of Group VIA material(s). One approach involves using gases such as $H_2Se$, $H_2S$ or their mixtures to react, either simultaneously or consecutively, with the precursor comprising Cu, In and/or Ga. This way a $Cu(In,Ga)(S,Se)_2$ film may be formed after annealing and reacting at elevated temperatures. It is possible to increase the reaction rate or reactivity by striking plasma in the reactive gas during the process of compound formation. Se vapors or S vapors from elemental sources may also be used for selenization and sulfidation. Alternately, as described before, Se and/or S may be deposited over the precursor layer comprising Cu, In and/or Ga and the stacked structure can be annealed at elevated temperatures to initiate reaction between the metallic elements or components and the Group VIA material(s) to form the $Cu(In,Ga)(S,Se)_2$ compound.

Reaction step in a two-stage process is typically carried out in batch furnaces. In this approach, a number of pre-cut substrates with precursor layers deposited on them are placed into a batch furnace and reaction is carried out for periods that may range from 15 minutes to several hours. Temperature of the batch furnace is typically raised to the reaction temperature, which may be in the range of 400-600 C, after loading the substrates. The ramp rate for this temperature rise is normally lower than 5 C/sec, typically less than 1 C/sec. One prior art method described in U.S. Pat. No. 5,578,503 utilizes a rapid thermal annealing (RTP) approach to react the precursor layers in a batch manner, one substrate at a time. In this design the temperature of the substrate with the precursor layer is raised to the reaction temperature at a high rate, typically at 10 C/sec.

Design of the reaction chamber to carry out selenization/sulfidation processes is critical for the quality of the resulting compound film, the efficiency of the solar cells, throughput, material utilization and cost of the process. Present invention provides methods and apparatus to carry out reaction of precursor layers for CIGS(S) type absorber formation, in a roll-to-roll manner. Roll-to-roll or reel-to-reel processing increases throughput and minimizes substrate handling. Therefore, it is a preferred method for large scale manufacturing.

SUMMARY

The present invention provides a method and integrated tool to form solar cell absorber layers on continuous flexible substrates. A roll-to-roll rapid thermal processing (RTP) tool including multiple chambers is used to react a precursor layer on a continuous flexible workpiece.

An aspect of the present invention provides an integrated roll-to-roll RTP tool with multiple chambers for forming a solar cell absorber by reacting a precursor layer on a surface of a continuous flexible workpiece. The tool includes an elongated housing including a vacuum line to pull vacuum inside the elongated housing. Further, a heating chamber of the elongated housing applies a predetermined temperature profile to the continuous flexible workpiece. The heating chamber extends between a first opening at a first end of the heating chamber and a second opening at a second end of the heating chamber, and includes a process gap defined by a top wall, a bottom wall, and side walls of the heating chamber. A gas inlet line disposed adjacent the first opening of the heating chamber delivers a process gas which may be inert or may comprise a Group VIA material into the heating chamber during the process. The continuous flexible workpiece is configured to be advanced through the process gap and between the first and the second openings during a process. Depending on the speed of the flexible workpiece in the process gap and the predetermined temperature profile of the heating chamber, portions of the flexible workpiece experiences a predetermined temperature vs. time profile during the reaction.

A supply chamber of the elongated housing holds a supply roll of the continuous flexible workpiece. The supply chamber is adjacent the first end of the heating chamber and the first opening connects an interior space of the supply chamber to the process gap and the continuous flexible workpiece is configured to be advanced into the heating chamber from the supply chamber through the first opening. A receiving chamber of the elongated housing receives the continuous flexible workpiece from the heating chamber. The second opening connects an interior space of the receiving chamber to the process gap and the continuous flexible workpiece is configured to be advanced into the receiving chamber from the process chamber through the second opening.

A moving mechanism holds and moves the continuous flexible workpiece within and through the process gap of the heating chamber, including a portion of the continuous flexible workpiece disposed within and processed in the process chamber, by feeding previously unrolled portions of the continuous flexible workpiece from the supply roll in the supply chamber and taking up and wrapping the processed portions of the continuous flexible workpiece in the receiving chamber.

An exhaust line disposed adjacent one of first and the second opening of the heating chamber removes the process gas and gaseous byproducts from the process chamber. The gas inlet line and the exhaust line are configured to allow presence of the process gas flow over the front surface of the continuous flexible workpiece as the continuous flexible workpiece is moved within the process gap.

DETAILED DESCRIPTION

Figure 1:
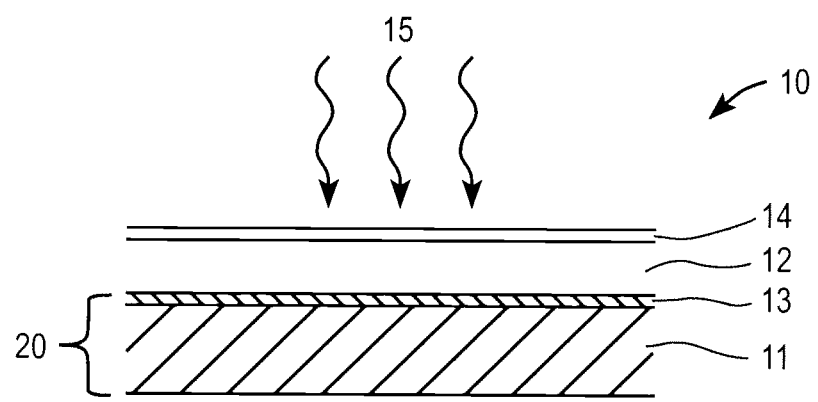
FIG. 1 is a cross-sectional view of a solar cell employing a Group IBIIIAVIA absorber layer.

Reaction of precursors, comprising Group IB material(s), Group IIIA material(s) and optionally Group VIA material(s) or components, with Group VIA material(s) may be achieved in various ways. These techniques involve heating the precursor layer to a temperature range of 350-600° C., preferably to a range of 400-575° C., in the presence of at least one of Se, S, and Te provided by sources such as; i) solid Se, S or Te sources directly deposited on the precursor, and ii) $H_2Se$ gas, H$_2$S gas, H$_2$Te gas, Se vapors, S vapors, Te vapors etc. for periods ranging from 1 minute to several hours. The Se, S, Te vapors may be generated by heating solid sources of these materials away from the precursor also. Hydride gases such as H$_2$Se and H$_2$S may be bottled gases. Such hydride gases and short-lifetime gases such as H$_2$Te may also be generated in-situ, for example by electrolysis in aqueous acidic solutions of cathodes comprising S, Se and/or Te, and then provided to the reactors. Electrochemical methods to generate these hydride gases are suited for in-situ generation.

Precursor layers may be exposed to more than one Group VIA materials either simultaneously or sequentially. For example, a precursor layer comprising Cu, In, Ga, and Se may be annealed in presence of S to form Cu(In,Ga)(S,Se)$_2$. The precursor layer in this case may be a stacked layer comprising a metallic layer containing Cu, Ga and In and a Se layer that is deposited over the metallic layer. Alternately, Se nanoparticles may be dispersed throughout the metallic layer containing Cu, In and Ga. It is also possible that the precursor layer comprises Cu, In, Ga and S and during reaction this layer is annealed in presence of Se to form a Cu(In,Ga)(S,Se)$_2$.

Some of the preferred embodiments of forming a Cu(In,Ga)(S,Se)$_2$ compound layer may be summarized as follows: i) depositing a layer of Se on a metallic precursor comprising Cu, In and Ga forming a structure and reacting the structure in gaseous S source at elevated temperature, ii) depositing a mixed layer of S and Se or a layer of S and a layer of Se on a metallic precursor comprising Cu, In and Ga forming a structure, and reacting the structure at elevated temperature in either a gaseous atmosphere free from S or Se, or in a gaseous atmosphere comprising at least one of S and Se, iii) depositing a layer of S on a metallic precursor comprising Cu, In and Ga forming a structure and reacting the structure in gaseous Se source at elevated temperature, iv) depositing a layer of Se on a metallic precursor comprising Cu, In and Ga forming a structure, and reacting the structure at elevated temperature to form a Cu(In,Ga)Se$_2$ layer and/or a mixed phase layer comprising selenides of Cu, In, and Ga and then reacting the Cu(In,Ga)Se$_2$ layer and/or the mixed phase layer with a gaseous source of S, liquid source of S or a solid source of S such as a layer of S, v) depositing a layer of S on a metallic precursor comprising Cu, In and Ga forming a structure, and reacting the structure at elevated temperature to form a Cu(In,Ga)S$_2$ layer and/or a mixed phase layer comprising sulfides of Cu, In, and Ga, and then reacting the Cu(In,Ga)S$_2$ layer and/or the mixed phase layer with a gaseous source of Se, liquid source of Se or a solid source of Se such as a layer of Se.

It should be noted that Group VIA materials are corrosive. Therefore, materials for all parts of the reactors or chambers that are exposed to Group VIA materials or material vapors at elevated temperatures should be properly selected. These parts should be made of or should be coated by substantially inert materials such as ceramics, e.g. alumina, tantalum oxide, titania, zirconia etc., glass, quartz, stainless steel, graphite, refractory metals such as Ta, refractory metal nitrides and/or carbides such as Ta-nitride and/or carbide, Ti-nitride and/or carbide, W-nitride and/or carbide, other nitrides and/or carbides such as Si-nitride and/or carbide, etc.

Reaction of precursor layers comprising Cu, In, Ga and optionally at least one Group VIA material may be carried out in a reactor that applies a process temperature to the precursor layer at a low rate. Alternately, rapid thermal processing (RTP) may be used where the temperature of the precursor is raised to the high reaction temperature at rates that are at least about 10° C./sec. Group VIA material, if included in the precursor layer, may be obtained by evaporation, sputtering, or electroplating. Alternately inks comprising Group VIA nano particles may be prepared and these inks may be deposited to form a Group VIA material layer within the precursor layer. Other liquids or solutions such as organometallic solutions comprising at least one Group VIA material may also be used. Dipping into melt or ink, spraying melt or ink, doctor-blading or ink writing techniques may be employed to deposit such layers.

Figure 2:
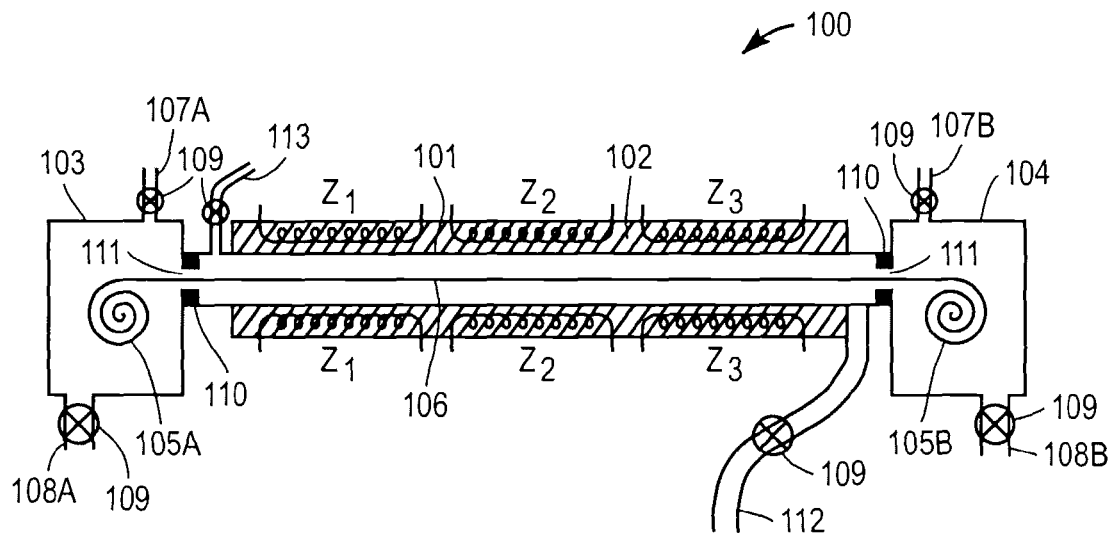
FIG. 2 shows an apparatus to react precursor layers in a reel-to-reel fashion to form a Group of IBIIIAVIA layer on a flexible foil base.

A reel-to-reel apparatus 100 or roll to roll RTP reactor to carry out reaction of a precursor layer to form a Group IBIIIAVIA compound film is shown in FIG. 2. It should be noted that the precursor layer to be reacted in this reactor may comprise at least one Group IB material and at least one Group IIIA material. For example the precursor layer may be a stack of Cu/In/Ga, Cu—Ga/In, Cu—In/Ga, Cu/In—Ga, Cu—Ga/Cu—In, Cu—Ga/Cu—In/Ga, Cu/Cu—In/Ga, or Cu—Ga/In/In—Ga etc., where the order of various material layers within the stack may be changed. Here Cu—Ga, Cu—In, In—Ga mean alloys or mixtures of Cu and Ga, alloys or mixtures of Cu and In, and alloys or mixtures of In and Ga, respectively. Alternatively, the precursor layer may also include at least one Group VIA material. There are many examples of such precursor layers. Some of these are Cu/In/Ga/Group VIA material stack, Cu-Group VIA material/In/Ga stack, In-Group VIA material/Cu-Group VIA material stack, or Ga-Group VIA material/Cu/In, where Cu-Group VIA material includes alloys, mixtures or compounds of Cu and a Group VIA material (such as Cu—selenides, Cu sulfides, etc.), In-Group VIA material includes alloys, mixtures or compounds of In and a Group VIA material (such as In-selenides, In sulfides, etc.), and Ga-Group VIA material includes alloys, mixtures or compounds of Ga and a Group VIA material (such as Ga-selenides, Ga sulfides, etc.). These precursors are deposited on a base 20 comprising a substrate 11, which may additionally comprise a conductive layer 13 as shown in FIG. 1. Other types of precursors that may be processed using the method and apparatus of the invention includes Group IBIIIAVIA material layers that may be formed on a base using low temperature approaches such as compound electroplating, electroless plating, sputtering from compound targets, ink deposition using Group IBIIIAVIA nano-particle based inks, spraying metallic nanoparticles comprising Cu, In, Ga and optionally Se, etc. These material layers are then annealed in the apparatus or reactors at temperatures in the 350-600° C. range to improve their crystalline quality, composition and density.

Annealing and/or reaction steps may be carried out in the reactors of the present invention at substantially the atmospheric pressure, at a pressure lower than the atmospheric pressure or at a pressure higher than the atmospheric pressure. Lower pressures in reactors may be achieved through use of vacuum pumps.

The reel-to-reel apparatus 100 of FIG. 2 may comprise an elongated heating chamber 101 that is surrounded by a heater system 102 which may have one or more heating zones such as Z1, Z2, and Z3 to form a temperature profile along the length of the chamber 101. In between zones there are preferably buffer regions of low thermal conductivity so that a sharp temperature profile may be obtained. Details of such use of buffer regions are discussed in U.S. application Ser. No. 11/549,590 entitled Method and Apparatus for Converting Precursor layers into Photovoltaic Absorbers, filed on Oct. 13, 2006, which is incorporated herein by reference. The chamber 101 is integrally sealably attached to a first port 103 and a second port 104. Integrally sealably means that the internal volume of chamber, the first port and the second port are sealed from air atmosphere, therefore, any gases used in the internal volume does not leak out (except at designated exhaust ports) and no air leaks into the internal volume. In other words the integration of the chamber, first and second ports are vacuum tight. A first spool 105A and a second spool 105B are placed in the first port 103 and the second port 104, respectively, and a continuous flexible workpiece 106 or flexible structure can be moved between the first spool 105A and the second spool 105B in either direction, i.e. from left to right or from right to left. The flexible structure includes a precursor layer to be transformed into an absorber layer in the elongated chamber. The first port 103 has at least one first port gas inlet 107A and a first port vacuum line 108A. Similarly, the second port 104 has at least one second port gas inlet 107B and may have a second port vacuum line 108B. The elongated heating chamber 101 as well as the first port 103 and the second port 104 may be evacuated through either or both of the first port vacuum line 108A and the second port vacuum line 108B. The chamber 101 is also provided with at least one gas line 113 and at least one exhaust 112. There may be additional vacuum line(s) (not shown) connected to the chamber 101. Valves 109 are preferably provided on all gas inlets, gas lines, vacuum lines and exhausts so that a common chamber is formed that can be placed under a single vacuum. There are preferably slits 110 at the two ends of the chamber 101, through which the flexible structure 106 passes through. Although, evacuation of the chamber and the first and second ports is the preferred method to get rid of air from the internal volume of the tool, purging the internal volume of the tool with a gas such as $N_2$ through designated exhaust port(s) is also possible.

The flexible structure 106A before the reaction may be a base with a precursor film deposited on at least one face of the base. The flexible structure 106B after the reaction comprises the base and a Group IBIIIAVIA compound layer formed as a result of reaction of the precursor layer. It should be noted that we do not distinguish between the reacted and unreacted sections of the flexible structure 106 in FIG. 2, calling both the flexible structure 106. We also refer to the flexible structure as a web irrespective of whether the precursor layer over it is reacted or unreacted. The substrate of the base may be a flexible metal or polymeric foil. As described above, the precursor film on the base comprises at least Cu, In, and Ga and optionally a Group VIA material such as Se. The back side 20A of the flexible structure 106 may or may not touch a wall of the chamber 101 as it is moved through the chamber 101. The process of the present invention will now be described through specific examples.

Example 1

Figure 3A:
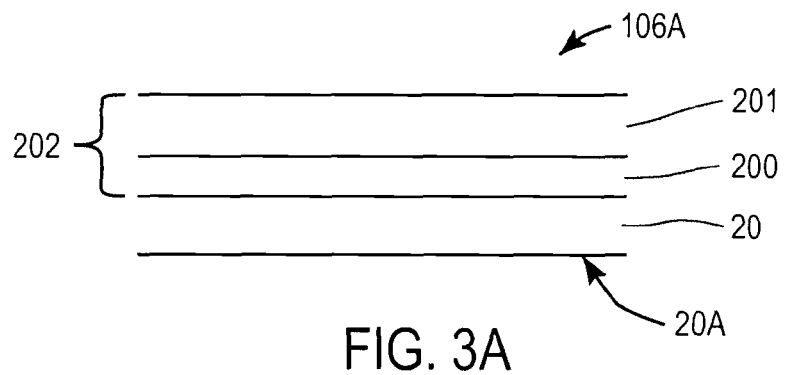
FIG. 3A shows an exemplary flexible structure comprising a flexible base and a precursor layer deposited on it.
Figure 3B:
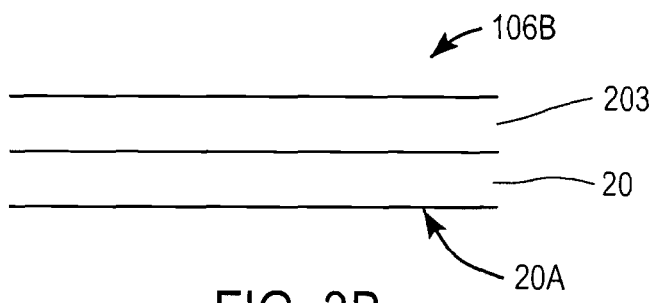
FIG. 3B shows a base with a Group IBIIIAVIA absorber layer formed on it by reacting the precursor layer(s) of FIG. 3A.

ACu(In,Ga)(Se,S)$_2$ absorber layer may be formed using the single chamber reactor design of FIG. 2. An exemplary flexible structure 106A before the reaction is shown in FIG. 3A. The base 20 may be similar to the base 20 of FIG. 1. A precursor layer 200 is provided on the base 20. The precursor layer 200 comprises Cu, and at least one of In and Ga. Preferably the precursor layer 200 comprises all of Cu, In and Ga. A Se layer 201 may optionally be deposited over the precursor layer 200 forming a Se-bearing precursor layer 202. Se may also be mixed in with the precursor layer 200 (not shown) forming another version of a Se-bearing precursor layer. The flexible structure after the reaction step is shown in FIG. 3B. In this case the flexible structure 106B comprises the base 20 and the Group IBIIIAVIA compound layer 203 such as a Cu(In,Ga)(Se,S)$_2$ film that is obtained by reacting the precursor layer 200 or the Se-bearing precursor layer 202.

After loading the unreacted flexible structure 106A or web on, for example, the first spool 105A, one end of the web may be fed through the chamber 101, passing through the gaps 111 of the slits 110, and then wound on the second spool 105B. Doors (not shown) to the first port 103 and the second port 104 are closed and the system (including the first port 103, the second port 104 and the chamber 101) is evacuated to eliminate air. Alternately the system may be purged through the exhaust 112 with an inert gas such as $N_2$ coming through any or all of the gas inlets or gas lines for a period of time. After evacuating or purging, the system is filled with the inert gas and the heater system 102 may be turned on to establish a temperature profile along the length of the chamber 101. When the desired temperature profile is established, the reactor is ready for process.

During the process of forming, for example, a Cu(In,Ga) Se$_2$ absorber layer, a gas comprising Se vapor or a source of Se such as H$_2$Se may be introduced into the chamber, preferably through chamber gas inlet 113. The exhaust 112 may now be opened by opening its valve so that Se bearing gas can be directed to a scrubber or trap (not shown). It should be noted that Se is a volatile material and at around the typical reaction temperatures of 400-600 C its vapor tends to go on any cold surface present and deposit in the form of solid or liquid Se. This means that, unless precautions taken during the reaction process, Se vapors may pass into the first port 103 and/or the second port 104 and deposit on all the surfaces there including the unreacted portion of the web in the first port 103 and the already reacted portion of the web in the second port 104. To minimize or eliminate such Se deposition, it is preferable to introduce a gas into the first port 103 through first port gas inlet 107A and introduce a gas into the second port 104 through the second port gas inlet 107B. The introduced gas may be a Se-bearing and/or S-bearing gas that does not breakdown into Se and/or S at low temperature, but preferably the introduced gas is an inert gas such as $N_2$ and it pressurizes the two ports establishing a flow of inert gas from the ports towards the chamber 101 through the gaps 111 of the slits 110.

The velocity of this gas flow can be made high by reducing the gaps 111 of the slits 110 and/or increasing the flow rate of the gas into the ports. This way diffusion of Se vapor into the ports is reduced or prevented, directing such vapors to the exhaust 112 where it can be trapped away from the processed web. The preferred values for the gap 111 of the slits 110 may be in the range of 0.5-5 mm, more preferably in the range of 1-3 mm. Flow rate of the gas into the ports may be adjusted depending on the width of the slits which in turn depends on the width of the flexible structure 106 or web. Typical web widths may be in the range of 1-4 ft.

Once the Se-bearing gas and inert gas flows are set and the desired temperature profile of the chamber 101 is reached, the flexible structure 106 may be moved from the first port 103 to the second port 104 at a pre-determined speed. This way, an unreacted portion of the flexible structure 106 comes off the first roll 105A, enters the chamber 101, passes through the chamber 101, gets reacted forming a Cu(In,Ga)Se$_2$ absorber layer on the base of the web and gets rolled onto the second spool 105B in the second port 104. It should be noted that there may be an optional cooling zone (not shown) within the second port 104 to cool the reacted web before winding it on the second spool 105B.

The above discussion is also applicable to the formation of absorber layers containing S. For example, to form a Cu(In, Ga)S$_2$ layer the Se-bearing gas of the above discussion may be replaced with a S-bearing gas such as H$_2$S. To form a Cu(In,Ga)(Se,S)$_2$, a mixture of Se-bearing gas and S-bearing gas may be used. Alternately, a Se-bearing precursor may be utilized and reaction may be carried out in a S-bearing gas.

One feature of the system 100 of FIG. 2 is that the flexible structure 106 may be moved from left to right as well as from right to left. This way more than one reaction step may be carried out. For example, a first reaction may be carried out as the web is moved from left to right, then a second reaction may be carried out as the web is moved from right to left and the reacted web may be unloaded from the first spool 105A. Of course even more steps of reaction or annealing etc., may be carried out by moving the web more times between the first spool 105A and the second spool 105B. Reaction conditions, such as gas flow rates and the reaction temperature may be different for the various reaction steps. For example, the temperature profile of the chamber 101 may be set to a maximum temperature of 400° C. for the first reaction step when the web is moved from left to right. This way the precursor of the web may be partially or fully reacted or annealed at 400 C.

After substantially all portions of the web is rolled on the second spool 105B, the maximum temperature of the temperature profile may be adjusted to a higher value, such as to 550° C., and the web may be moved from right to left as the already annealed or reacted precursor layer may be further reacted, annealed or crystallized, this time at the higher temperature of 550° C. It should be noted that a similar process may be achieved by making the chamber 101 longer and setting a temperature profile along the chamber 101 such that as the web travels from left to right, for example, it travels through a zone at 400° C. and then through a zone at 550° C. However, using bi-directional motion as described above, the length of the chamber 101 may be reduced and still the two step/two temperature reaction may be achieved. To keep the temperature of the web high when it is rolled onto either one of the first spool 105A or the second spool 105B in between reaction steps, there may be optional heaters (not shown) placed in either or both of the first port 103 and the second port 104.

It should be noted that in addition to the reactor temperature and the web speed, the reaction gas composition may also be changed in the multi-step reaction approach described above. For example, during the first reaction step when the web is moved from left to right a first gas such as $H_2Se$ may be used in the chamber 101 to form a selenized precursor layer. During the second reaction step when the web is moved from right to left, on the other hand, another gas such as $H_2S$ may be introduced in the chamber 101. As a result, the selenized precursor layer may be reacted with S as the web is moved from the second spool 105B to the first spool 105A and thus a $Cu(In,Ga)(Se,S)_2$ layer may be grown by converting the already selenized precursor layer into sulfo-selenide. Selecting the gas concentrations, web speeds and reaction temperatures the amount of Se and S in the absorber layer may be controlled. For example, S/(Se+S) molar ratio in the final absorber layer may be increased by increasing the web speed and/or reducing the reaction temperature during the first process step when reaction with Se is carried out. Similarly, the S/(Se+S) molar ratio may also be increased by reducing the web speed and/or increasing the reaction temperature during the second step of reaction where reaction with S is carried out. This provides a large degree of flexibility to optimize the absorber layer composition by optimizing the two reaction steps independent from each other.

Figure 4:
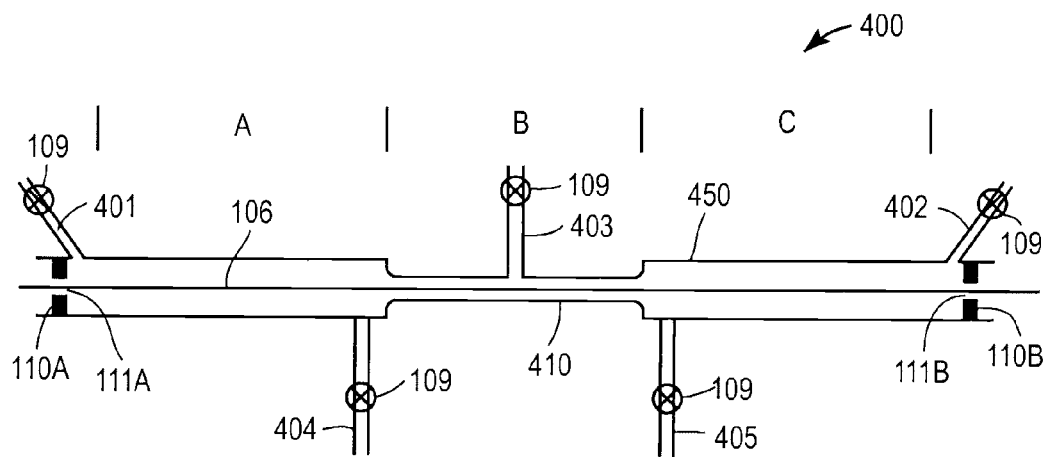
FIG. 4 shows another apparatus to react precursor layers in a reel-to-reel fashion to form a Group IBIIIAVIA layer on a flexible foil base.

Another embodiment of the present invention is shown in FIG. 4. The reactor system 400 in FIG. 4 comprises a three-section chamber 450 which is an example of a more general multi-chamber design. The three-section chamber 450 of FIG. 4 comprises sections A, B and C. Heating means around each section as well as the first port, the first spool, the second port and the second spool are not shown in this figure to simplify the drawing. However, designs similar to those shown in FIG. 2 may be used for such missing parts. The heating means may be heat lamps, heater coils etc. and they may have independent controls to yield different temperature values and profiles in the sections of A, B and C.

Important feature of the design of FIG. 4 is that sections A and C are separated by a segment, preferably a low-volume segment 410 which is within section B of the three-section chamber 450. There are means to bring gas into each of the sections A, B and C. For example, inlets 401 and 402 may bring gas into sections A and C, respectively, whereas inlet 403 may bring gas into the low-volume segment 410 in section B. Exhausts 404 and 405 may be provided to exhaust gases from sections A and C, respectively. A flexible structure 106 to be processed or reacted may pass through a first gap 111A of a first slit 110A, enter the three-section chamber 450 and then exit through the second gap 111B of a second slit 110B.

Example 2

A $Cu(In,Ga)(Se,S)_2$ absorber layer may be formed using the three-section chamber reactor of FIG. 4. After loading the unreacted flexible structure 106, pumping and purging the system as described in Example 1, the process may be initiated. Sections A, B and C of the three-section chamber 450 may have temperatures of T1, T2 and T3 which may or not be equal to each other. Furthermore, each of the sections A, B and C may have a temperature profile rather than just a constant temperature along their respective lengths. During processing, a first process gas such as $N_2$ may be introduced into the low-volume segment 410 in section B through inlet 403, while a second process gas and a third process gas may be introduced in sections A and C, respectively, through inlets 401 and 402, respectively.

The second process gas and the third process gas may be the same gas or two different gases. For example, the second process gas may comprise Se and the third process gas may comprise S. This way when a portion on the flexible structure 106 enters the section A of the three-section chamber 450 through the first gap 111A of the first slit 110A, the precursor layer on the portion starts reacting with Se forming a selenized precursor layer on the portion. When portion enters the low-volume segment 410, it gets annealed in the $N_2$ gas (if section B is heated) within this segment until it enters section C. In section C sulfidation or sulfurization takes place due to presence of gaseous S species, and a $Cu(In,Ga)(Se,S)_2$ absorber layer is thus formed on the portion before the portion exits the three-section chamber 450 through the second gap 111B of the second slit 110B. The S/(Se+S) molar ratio in the absorber layer may be controlled by the relative temperatures and lengths of the sections A and C. For example, at a given web speed the S/(Se+S) ratio may be increased by decreasing the length and/or reducing the temperature of section A.

Alternately, or in addition, the length and/or the temperature of section C may be increased. Reverse may be done to reduce the S/(Se+S) molar ratio. It should be noted that, as in the previous example, it is possible to run the flexible structure or web backwards from right to left to continue reactions. It is also possible to change the gases introduced in each section A, B and C of the three-section chamber 450 to obtain absorber layers with different composition. The design of FIG. 4 has a unique feature of allowing two different gases or vapors to be present in two different sections of the reactor so that reel-to-reel continuous processing may be done on a web substrate by applying different reaction temperatures and different reaction gases in a sequential manner to each portion of the web. Introducing an inert gas to a reduced volume segment in between the two sections (sections A and C in FIG. 4) acts as a diffusion barrier and minimizes or eliminates intermixing between the different gases utilized in those two sections. The first gas introduced through inlet 403 in FIG. 4 flows through the low-volume segment 410 to the right and to the left opposing any gas flows from sections A and C towards each other. It should be noted that more sections may be added to the reactor design of FIG. 4 with more low-volume segments between them and each section may run with different temperature and gas to provide process flexibility for the formation of high quality Group IBIIIAVIA compound absorber layers. Also more gas inlets and/or exhaust may be added to the system of FIG. 4 and locations of these gas inlets and exhaust may be changed.

Figure 5A:
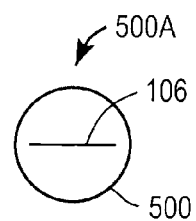
FIG. 5A-5B show cross-sectional views of different reaction chambers with a flexible structure placed in them.
Figure 5B:
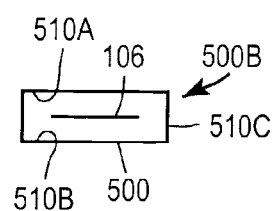

A variety of different cross sectional shapes may be used for the chambers of the present invention. Two such chambers 500A and 500B having circular and rectangular cross sections, respectively, are shown in FIGS. 5A and 5B. Substantially cylindrical reaction chambers with circular cross section are good for pulling vacuum in the chamber even if the chamber is made from a material such as glass or quartz. The circular chambers however, get very large as the substrate or web width increases to 1 ft, 2 ft or beyond. Temperature profiles with sharp temperature changes cannot be sustained using such large cylindrical chambers and thus roll-to-roll RTP process cannot be carried out on wide flexible substrates such as substrates that may be 1-4 ft wide or even wider.

As shown in FIG. 5B, the chamber 500B includes a rectangular gap defined by the top wall 510A, bottom wall 510B, and the side walls 510C. In this case the chamber is preferably constructed of metal because for pulling vacuum in such a chamber without breaking it requires very thick walls (half an inch and larger) if the chamber is constructed of quartz or glass. In this configuration, the top wall 510A and the bottom wall 510B are substantially parallel to each other, and the flexible structure 106 is placed between them. Chambers with rectangular cross section or configuration is better for reducing reactive gas consumption since the height of such chambers may be reduced to below 10 mm, the width being approximately close to the width of the flexible structure (which may be 1-4 ft). Such small height also allows reaction in Group VIA vapor without the need to introduce too much Group VIA material into the chamber. It should be noted that the height of the chamber 500B, i.e., gap size, is the distance between the top and the bottom walls and small gap size is necessary to keep a high overpressure of Group VIA material over the surface of the precursor layer during reaction. Also these chambers can hold sharply changing temperature profiles even for flexible substrate widths beyond 4 ft. For example, a temperature profile along the length of a chamber with a rectangular cross-section may comprise a temperature change of 400-500 C within a distance of a few centimeters. Such chambers, therefore, may be used in roll-to-roll RTP mode wherein a section of a precursor film on a substrate travelling at a speed of a few centimeters per second through the above mentioned temperature change experiences a temperature rise rate of 400-500 C/sec. Even higher rates of a few thousand degrees C. per second may be achieved by increasing the speed of the substrate.

Figure 5C:
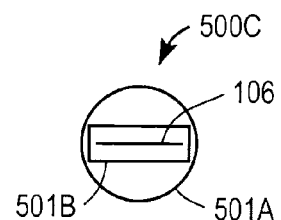
FIG. 5C shows a cross-sectional view of a reaction chamber comprising an outer chamber and an inner chamber.

As shown in cross sectional view in FIG. 5C, another preferred chamber design includes a dual chamber 500C where an inner chamber 501B with rectangular cross section is placed within a cylindrical outer chamber 501A with circular cross section. In this case the flexible structure 106 or web passes through the inner chamber 501B which may be orthorhombic in shape and all the gas flows are preferably directed to and through the inner chamber 501B which has a much smaller volume than the outer chamber 501A. This way waste of reaction gases is minimized but at the same time the whole chamber may be easily evacuated because of the cylindrical shape of the outer chamber 501B, even though the chamber may be made out of a material such as quartz. Heaters (not shown) in this case may be placed outside the inner chamber 501B, but inside the outer chamber 501A. This way sharp temperature profiles can be sustained along the length of the rectangular cross section chamber while having the capability to evacuate the reactor body.

Figure 6:
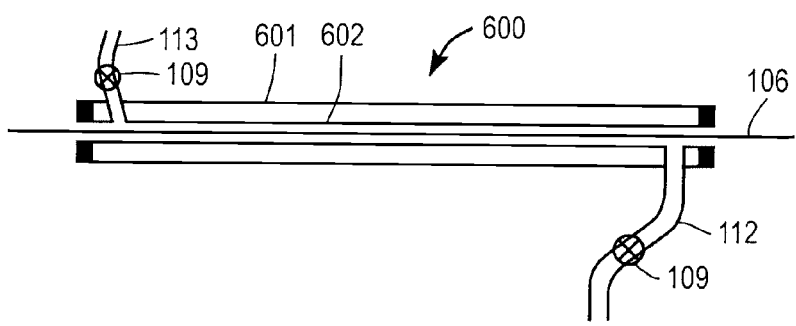
FIG. 6 shows such an exemplary version of the reactor of FIG. 2.

FIG. 6 shows such an exemplary version of the reactor of FIG. 2 within the dual chamber 500C shown in FIG. 5C above. Only the chamber portion is shown for simplifying the drawing. As can be seen from this figure, the dual-chamber 600 comprises a cylindrical chamber 601 and an orthorhombic chamber 602 which is placed in the cylindrical chamber 601. Gas inlet 113 and exhaust 112 are connected to the orthorhombic chamber 602. It should be noted that the cylindrical chamber 601 may not be hermetically sealed from the orthorhombic chamber so that when the overall chamber is pumped down, pressure equilibrates between the cylindrical chamber 601 and the orthorhombic chamber. Otherwise, if these chambers are sealed from each other, they may have to be pumped down together at the same time so that there is not a large pressure differential between them.

Solar cells may be fabricated on the compound layers formed in the reactors of the present invention using materials and methods well known in the field. For example a thin (<0.1 microns) CdS layer may be deposited on the surface of the compound layer using the chemical dip method. A transparent window of ZnO may be deposited over the CdS layer using MOCVD or sputtering techniques. A metallic finger pattern is optionally deposited over the ZnO to complete the solar cell.

Although the present invention is described with respect to certain preferred embodiments, modifications thereto will be apparent to those skilled in the art.

What is claimed is:

1. An integrated roll-to-roll rapid thermal processing (RTP) tool for forming a solar cell absorber by reacting a precursor layer on a surface of a continuous flexible workpiece, the tool comprising:

an elongated housing that includes a sealed common chamber, the sealed common chamber including a heating chamber, a heating element, a supply chamber, a receiving chamber and an outer enclosure around the heating chamber that forms a seal within the outer enclosure, including the sealed common chamber, wherein;

the heating chamber defines a narrow process gap that applies a predetermined temperature profile using the heating element to that portion of the continuous flexible workpiece disposed therein, the narrow process gap defined by a top wall, a bottom wall, and side walls that form an opening in which a height is substantially less than a width thereof, and wherein the heating chamber has a heating chamber input opening and a heating chamber output opening, and wherein the heating element is disposed within the outer enclosure, outside of the heating chamber and outside of the narrow process gap;

the supply chamber that holds a supply roll of the continuous flexible workpiece and has a supply chamber opening, wherein the supply chamber opening aligns with the heating chamber input opening and wherein the continuous flexible workpiece is configured to be advanced into the heating chamber from the supply chamber;

the receiving chamber that holds a receiving roll to collect the continuous flexible workpiece from the heating chamber and has a receiving chamber opening, wherein the receiving chamber opening aligns with the heating chamber output opening and wherein the continuous flexible workpiece is configured to be advanced into the receiving chamber from the heating chamber; and a moving mechanism to hold the continuous flexible workpiece within the common chamber and move the continuous flexible workpiece through the narrow process gap of the heating chamber by feeding previously unrolled portions of the continuous flexible workpiece from the supply roll and taking up and wrapping processed portions of the continuous flexible workpiece on the receiving roll in the receiving chamber.

2. The tool of claim 1 further including a vacuum line associated with the common chamber that allows formation of a vacuum therein and evacuation thereof.

3. The tool of claim 2 further comprising an exhaust line disposed between the heating chamber input opening and the heating chamber output opening so as to remove a process gas and gaseous byproducts from the narrow process gap of the heating chamber; and a gas inlet line disposed adjacent to the heating chamber input opening that introduces the process gas into the narrow process gap of the heating chamber, such that the process gas flows in the direction of movement of the continuous flexible workpiece and is substantially contained within the narrow process gap.

4. The tool of claim 3 wherein the gas inlet line provides a Group VIA material process gas into the heating chamber.

5. The tool of claim 2, wherein the supply chamber and the receiving chamber include independent gas inlets to deliver an inert gas directly into the supply and receiving chambers.

6. The tool of claim 4, wherein the supply chamber and the receiving chamber include independent gas inlets to deliver an inert gas directly into the supply and receiving chambers.

7. The tool of claim 2 wherein a distance between the top wall and the bottom wall varies across the length of the process gap of the heating chamber.

8. The tool of claim 1, wherein the heating chamber input opening and the heating chamber output opening each include a spacer that defines a gap that is smaller than the process gap.

9. The tool of claim 1, wherein the top wall of the heating chamber is substantially parallel to the bottom wall of the heating chamber.

10. The tool of claim 9, wherein the height of the narrow process gap is in the range of 0.5-10 mm.

11. The tool of claim 10, wherein the width of the narrow process gap is in the range of 100 to 2000 mm.

12. The tool of claim 1, wherein the temperature profile comprises a maximum temperature within the range of 350 to 600° C.

13. A rapid thermal processing (RTP) system to form a solar cell absorber by reacting a precursor layer previously deposited on a surface of a continuous flexible workpiece, the system comprising:

a heating chamber that allows formation of a vacuum therein and evacuation thereof, the heating chamber including first process section, a diffusion barrier section and a second process section, the heating chamber providing a predetermined temperature profile to that portion of the continuous flexible workpiece that is advanced therethrough, wherein the first process section with at least a first heating element processes by heating that portion of the continuous flexible workpiece disposed therein in presence of at least one first gaseous species, the first process section including a first narrow process gap that applies a first predetermined temperature profile to that portion of the continuous flexible workpiece disposed therein, the first narrow process gap defined by a first top wall, a first bottom wall, and first side walls that form a first opening in which a first process section height is substantially less than a first process section width, wherein the first heating element is disposed outside of the first narrow process gap;

the second process section with at least a second heating element processes by heating that portion of the continuous flexible workpiece disposed therein in presence of at least one second gaseous species, the second process section including a second narrow process gap that applies a second predetermined temperature profile to that portion of the continuous flexible workpiece disposed therein, the second narrow process gap defined by a second top wall, a second bottom wall, and second side walls that form a second opening in which a second process section height is substantially less than a second process section width, wherein the second heating element is disposed outside of the second narrow process gap;

the diffusion barrier section with at least a third heating element, disposed between the first and the second sections, separating the processes of the first and second process sections by applying an inert gas into the diffusion barrier section so that the inert gas flows from a central area of the diffusion barrier section towards, the first process section and towards the second process section, thereby creating a barrier to reduce intermixing of the at least one first gaseous species and the at least one second gaseous species, wherein the diffusion barrier section applies a third predetermined temperature profile while annealing the portion of the workpiece in the inert gas as it travels through the diffusion barrier section; and a moving mechanism to hold and move the continuous flexible workpiece within and through the sections of the heating chamber by feeding previously unrolled portions of the continuous flexible workpiece from a supply roll into the heating chamber and taking up and wrapping processed portions of the continuous flexible workpiece around a receiving roll.

14. The system of claim 13 further comprising at least one exhaust connected to at least one of the first process section and the second process section to remove gaseous species and reaction byproducts therein.

15. The system of claim 14 further comprising a supply chamber to hold the supply roll of the continuous flexible workpiece, wherein the supply chamber is integrated with the heating chamber.

16. The system of claim 15 further comprising a receiving chamber to hold the receiving roll of the continuous flexible workpiece, wherein receiving chamber is integrated with the heating chamber.

17. The system of claim 16, wherein the supply chamber and the receiving chamber include gas inlets to deliver an inert gas into the supply and receiving chambers.

18. The system of claim 14, wherein the first and second process sections include gas inlets.

19. The system of claim 14, wherein each of the first and second top walls are parallel to each of the first and second bottom walls, respectively.

20. The system of claim 19, wherein a height between each of the first and second top walls and each of the first and second bottom wall of the first and second process sections is at least twice the height between a diffusion barrier section top wall and a diffusion barrier section bottom wall.

21. The system of claim 14, wherein a height between each of the first and second top walls and each of the first and second bottom walls, respectively of the first and second process sections is in the range of 0.5-10 mm.

22. The system of claim 21, wherein a width between sidewalls of the first and second process sections is in the range of 100 to 2000 mm.

23. The system of claim 13, wherein the temperature profile comprises a maximum temperature within a range of 350 to 600° C.

24. The tool of claim 1 wherein the heating chamber includes at least two independently controlled temperature zones therein.

25. The tool of claim 24 wherein the at least two independently controlled temperature zones therein have a different temperature therein, with a second temperature zone being higher than a first temperature zone, such that movement of the portion of the continuous flexible workpiece through the at least two independently controlled temperature zones causes the portion of the continuous flexible workpiece to be within the each of the at least two independently controlled first and second temperature zones for periods dependent upon a rate of movement of the portion of the continuous flexible workpiece.

26. The tool of claim 24 wherein a temperature change of at least 400° C. occurs to the portion of the continuous flexible workpiece between the first and the second temperature zones.

27. The tool of claim 25 wherein a ratio of the width to the height of the narrow process gap is less than 1/10.

28. The tool of claim 27 wherein the heating chamber, the supply chamber and the receiving chamber have a width of between 1-4 feet to accommodate the width of the continuous flexible workpiece.

29. The tool of claim 9 wherein a ratio of the width to the height of the narrow process gap is less than 1/10.

30. The tool of claim 29 wherein the heating chamber, the supply chamber and the receiving chamber have a width of between 1-4 feet to accommodate the width of the continuous flexible workpiece.

31. The tool of claim 1 wherein no tool component is disposed within the heating chamber between the wall of the heating chamber adjacent to where the heating element is disposed and a top surface of the precursor layer of the continuous flexible workpiece.

32. The tool of claim 1, wherein the supply chamber and the receiving chamber each include an independently controlled heating element, separate from another independently controlled heating element within the heating chamber, to provide the predetermined temperature profile to the continuous flexible workpiece.

33. The tool of claim 6, wherein the top wall of the heating chamber is substantially parallel to the bottom wall of the heating chamber.

34. The tool of claim 33, wherein the height of the narrow process gap is in the range of 0.5-10 mm.

35. The tool of claim 34, wherein the width of the narrow process gap is in the range of 100 to 2000 mm.

36. The tool of claim 33 wherein a ratio of the width to the height of the narrow process gap is less than 1/10.

37. The tool of claim 36 wherein the heating chamber, the supply chamber and the receiving chamber have a width of between 1-4 feet to accommodate the width of the continuous flexible workpiece.

38. The tool of claim 13 wherein at least one of the first process section and the second process section includes at least two independently controlled heating elements therein.

39. The tool of claim 38 wherein the at least two independently controlled heating elements are controlled to have different temperatures associated therewith, with a second temperature zone being higher than a first temperature zone, such that movement of the portion of the continuous flexible workpiece causes the portion of the continuous flexible workpiece to be within the each of the first and second temperature zones for periods dependent upon a rate of movement of the portion of the continuous flexible workpiece.

40. The tool of claim 39 wherein a temperature change of at least 400° C. occurs to the portion of the continuous flexible workpiece between the first and the second temperature zones.

41. The tool of claim 13 wherein no tool component is disposed within the heating chamber between the wall of the heating chamber adjacent to where the heating element is disposed and a top surface of the precursor layer of the continuous flexible workpiece.

42. The tool of claim 13 wherein the supply chamber and the receiving chamber each include an independently controlled heating element, separate from other independently controlled heating elements within the first process section, the second process section, and the diffusion barrier section, to provide the predetermined temperature profile to the continuous flexible workpiece.

43. The tool of claim 13, wherein the first top wall of the first process section is substantially parallel to the first bottom wall of the first process section and the second top wall of the second process section is substantially parallel to the second bottom wall of the second process section.

44. The tool of claim 43, wherein the height of the first narrow process gap and the second narrow process gap are each in the range of 0.5-10 mm.

45. The tool of claim 34, wherein the width of the first narrow process gap and the second narrow process gap are each in the range of 100 to 2000 mm.

46. The tool of claim 43 wherein a ratio of the width to the height of the first narrow process gap and the second narrow process gap is each less than 1/10.

47. The tool of claim 46 wherein the first process section, the second process section, the diffusion barrier section, and the supply chamber and the receiving chamber have a width of between 1-4 feet to accommodate the width of the continuous flexible workpiece.

48. The tool of claim 13 wherein the first predetermined temperature profile is different than the second predetermined temperature profile.

49. The tool of claim 13 wherein each of the first process section and the second process section includes an independently controlled heating element therein.

50. The tool of claim 49 wherein the first predetermined temperature profile is different than the second predetermined temperature profile.

51. The tool of claim 50 wherein at least one of the first process section and the second process section have at least first and second independently controlled heating elements therein that are controlled to have different temperatures associated therewith.

52. The tool of claim 50 wherein each of the first process section and the second process section has at least first and second independently controlled heating elements therein that are controlled to have different temperatures associated therewith.

\* \* \* \* \*